(12) United States Patent
Yamada et al.

(10) Patent No.: US 6,451,391 B1
(45) Date of Patent: Sep. 17, 2002

(54) THIN FILM FORMATION METHOD

(75) Inventors: Yuka Yamada, Kawasaki; Takehito Yoshida, Machida; Nobuyasu Suzuki; Toshiharu Makino, both of Tsukuba, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/392,794

(22) Filed: Sep. 9, 1999

(30) Foreign Application Priority Data

Sep. 10, 1998 (JP) .......................................... 10-256156
Sep. 1, 1999 (JP) .......................................... 11-247205

(51) Int. Cl.⁷ .......................... C23L 14/32; C23C 16/40
(52) U.S. Cl. ........................ 427/586; 427/588; 427/590
(58) Field of Search .......................... 427/62, 596, 554, 427/586, 588, 590; 204/192.1

(56) References Cited

U.S. PATENT DOCUMENTS 5,281,575 A * 1/1994 Hase et al. .................... 427/62
5,360,785 A * 11/1994 Yoshida et al. ................ 427/62
5,374,613 A * 12/1994 Noda et al. .................... 427/62
5,534,489 A * 7/1996 Hayashi et al. ................ 427/62
6,245,451 B1 * 6/2001 Kamisawa et al. ..... 427/255.32

FOREIGN PATENT DOCUMENTS

JP 62222058 9/1987
JP 5-270830 10/1993

* cited by examiner

Primary Examiner—Bret Chen
(74) Attorney, Agent, or Firm—Greenblum & Bernstein, P.L.C.

(57) ABSTRACT

In a laser ablation method comprising the steps of irradiating a laser beam to target material 107, and depositing ejected species from the target material on a faced substrate 109 to form a thin film, an ambient gas is introduced into reaction chamber 101 under a constant certain pressure when the laser ablation is performed, using a target material with almost or the same composition as that of a thin film to be obtained. It is thereby possible to obtain a thin film with the same composition as that of the target material readily, without requiring an introduction of $O_2$ gas and a substrate heating. As a result, it is not necessary to limit materials for a substrate, and it is possible to adjust the adaptability of an anaerobic process.

15 Claims, 12 Drawing Sheets

THIN FILM FORMATION METHOD

BACKGROUND OF THE INVENTION

1. Field of the Invention

The present invention relates to a formation method of thin films, and a functional material and applied device therewith, in particular, to a formation method of transparent conducting oxide thin films for use in transparent electrodes, and a formation method of ferroelectric thin films for use in nonvolatile random access memory.

2. Description of the Related Art

A transparent conducting oxide thin films such as tin oxide ($SnO_2$) or indium oxide ($In_2O_3$) have not only moderate conductivity, but also high transmittance in a visible wavelength range and excellent film strength as compared to metal thin films. For these reasons, such films are widely applied to, for example, electrodes for flat panel display. Further, a thin film composed of ferroelectric material such as lead zirconatea/lead titanate (PZT:$Pb(Zr,Ti)O_3$) or strontium bismuth tantalate (SMT:$SrBi_2TA_2O_9$) is expected as a new material to be applied to a nonvolatile memory with high rate, low power consumption and high accumulation.

A conventional formation method of such oxide thin films are classified into chemical film formation method and physical film formation method. The chemical film formation method includes spray, chemical vapor deposition, sol-gel method, coating or the like, where oxide is formed on a heated substrate by thermal decomposition of the compound such as chloride. Since these methods require a reaction temperature of usually 500° C. or more, there are problems that materials for the substrate are limited, and that film properties are changed due to a material of the substrate.

On the contrary, as the physical film formation method, there are vacuum deposition, sputtering and the like. Such methods include a method in which metal or oxide, used as a starting material, is deposited on a heated substrate in an atmosphere of oxygen under a suitable pressure, another method in which a thin film composed of lower oxide or metal is formed on a substrate by vacuum deposition or sputtering, and then the formed film is oxidized by post-heat treatment, and the other method in which a deposited film which is formed in an atmosphere of prepurified oxygen gas is reduced by post-heat treatment. However, there is a problem that the formation of transparent conducting thin film requires the introduction of oxygen gas and substrate heating (about 300° C. or more) to obtain low resistance and high transparency. Further, the formation of ferroelectric thin film requires the heating of 600° C. or more in an atmosphere of oxygen to obtain a crystalline thin film with no oxygen deficiency.

On the other hand, a laser ablation method with low damage and non-thermal equilibrium processes is suitable for a formation of thin film of which properties such as contamination of impurity, crystallinity and surface condition. should be controlled. Further, in the laser ablation method, it is possible to form a thin film using various gases under a gas pressure condition with a wide range because of the transparency of laser beam. Since such characteristics do not depend on melting point and vapor pressure of material very much, the laser ablation method is expected to be applied to a formation of film of multicomponent material formed by processing (vaporizing and depositing) materials with different melting points and vapor pressures, which has been regarded as difficult to perform in a conventional thermal equilibrium process technology. For example, Japanese unexamined patent publication No. 5-270830 discloses that the laser ablation method is used in forming a superconducting oxide thin film and ceramic thin film. Further, Japanese unexamined patent publication No. 62-222058 discloses that the laser ablation method is used in forming a transparent conducting film.

However, materials ejected from a surface of oxide target by the laser ablation are vaporized with the target composition not held, and scattered as elements composing the target compound, whereby when the film formation is performed in a vacuum atmosphere, vaporized materials with lack of element having high vapor pressure (oxygen in this case) reach a substrate. For this reason, in the case where a thin film of indium tin oxide (ITO) is formed, fine particles of In or fine particles with excessive in are formed in the form of an island, with oxygen deficiency. Therefore, the thin film obtained by this method is inferior in transparency and conductivity. Further, in the case where a PZT thin film is formed using the laser ablation method, due to deficiency of Pb and O, capacity characteristics of the obtained thin film deteriorate. Such a problem should be solved to apply the laser ablation to the production of memory and the like. Because of it, a conventional case of a formation of oxide thin film using the above-mentioned laser ablation method requires the introduction of oxygen gas and the heating of substrate (about 300° C. or more). When the heating of substrate is performed during the film formation in such a way, there is problem in a reactivity between materials used for in film formation and a substrate. Further, when oxygen gas is introduced in the laser ablation method, there is another problem that it is difficult to adjust the adaptability of an anaerobic process, for example, in semiconductor manufacturing processes.

SUMMARY OF THE INVENTION

An object of the present invention is to provide a thin film formation method capable of obtaining a thin film with the same composition as a target material easier than a conventional method.

This object is achieved by a thin film formation method comprising the steps of placing a target material and a substrate in a reaction chamber, adjusting a pressure (P) of an ambient gas to be introduced to the reaction chamber and a distance (D) between the substrate and the target material so as to optimize a size of an area with a high temperature and a high pressure formed at a place around the target material, and forming a thin film by irradiating a laser beam to the target material to be excited, while introducing the ambient gas into the reaction chamber under the pressure, and depositing species, contained in the target material, ejected from the target material on the substrate.

Thus, the present invention relates to a thin film formation method comprising placing a target material and a substrate in a reaction chamber; adjusting a pressure (P) of an ambient gas to be introduced to the reaction chamber and a distance (D) between the substrate and the target material so that crystal nucleus growth in a vapor phase is carried out in an area in which oxidization is promoted and which forms shock front caused by irradiating a laser beam to the target material; exciting the target material by irradiating the laser beam to the target material, while introducing the ambient gas into the reaction chamber under the pressure; and forming a thin film by depositing species, which are contained in the target material and ejected from the target material by being irradiated by the laser beam on the substrate.

Moreover, the present invention is directed to a thin film formation method comprising placing a substrate and a target material including at least two kinds of areas with different compositions in a target material in a reaction chamber; adjusting a pressure (P) of an ambient gas and a distance (D) between the substrate and the target material so that crystal nucleus growth in a vapor phase is carried out in an area in which oxidization is promoted and which forms shock front caused by irradiating a laser beam to the target material; exciting the target material by irradiating the laser beam to the target material, while introducing the ambient gas into the reaction chamber under the pressure; and forming a thin film by depositing species, which are contained in the target material and ejected from the target material by being irradiated by the laser beam, on the substrate.

Still further, the present invention is directed to an optoelectronic material obtainable by placing a substrate and a target material including at least two kinds of areas with different compositions in a target material in a reaction chamber; adjusting a pressure (P) of an ambient gas and a distance (D) between the substrate and the target material so that crystal nucleus growth in a vapor phase is carried out in an area in which oxidization is promoted and which forms shock front caused by irradiating a laser beam to the target material; exciting the target material by irradiating the laser beam to the target material, while introducing the ambient gas into the reaction chamber under the pressure; and forming a thin film by depositing species, which are contained in the target material and ejected from the target material by being irradiated by the laser beam, on the substrate.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE PREFERRED EMBODIMENTS

First Embodiment

A thin film formation method of the present invention will be described in detail below with reference to FIG. 1 to FIG. 6.

This embodiment will describe about a formation method of transparent conducting oxide thin film. In this embodiment, a transparent conducting oxide material is deposited on a substrate by use of laser ablation method in inert background gas such as Ar or He. In the laser ablation method, a laser beam with a high energy density (the pulse energy is about 1.0 J/cm$^2$ or more) is irradiated to a target material, whereby a surface of the irradiated target material is melted and elements thereof are ejected from the surface.

The characteristic of this method is that a process therein has a non-thermal equilibrium characteristic and a non-mass characteristic. A specific effect of the non-thermal equilibrium characteristic includes that such a method enables the spatial time-variant selective excitation. Particularly, since the method has the spatial selective excitation characteristic, it is possible to excite a required source material, thus resulting in a clean process in which the contamination of impurities is depressed. On the contrary, in conventional heat treatment and plasma process, a fairly wide area or the whole area of a reaction chamber is exposed to heat and ions. Further, the non-mass characteristic means that an extremely low damage characteristic as compared to an ion process that also has non-thermal equilibrium characteristic. Ejected species in the laser ablation are primarily ions and neutral particles such as atoms, molecules and clusters (that is composed of several to tens of atoms), and the kinetic energies of the ion and neutral particle respectively reach a level of two digits eV and a level of one digit eV. Those levels are much higher than the kinetic energy of a thermal vaporized atom, however much lower than the kinetic energy of an ion beam.

The laser ablation process that is clean and has low damage is suitable for the formation of thin film of which properties such as contamination of impurity, crystallinity and surface condition should be controlled. In addition, it is desired that a target material have an absorption in a wavelength range of a laser beam used as a light source in order to perform the thin film formation using the laser ablation method. Generally, since a bandgap of transparent conducting oxide material is about 3 eV or more, it is desired that an excimer laser or a YAG laser with harmonic wave be used as a light source.

FIG. 1 illustrates a diagram of a thin film formation apparatus for use in a thin film formation method of the present invention. The following description explains the case where a homogeneous transparent conducting oxide thin film is formed by performing the laser ablation with a homogeneous transparent conducting oxide as a target material.

Figures 1A, 1B:
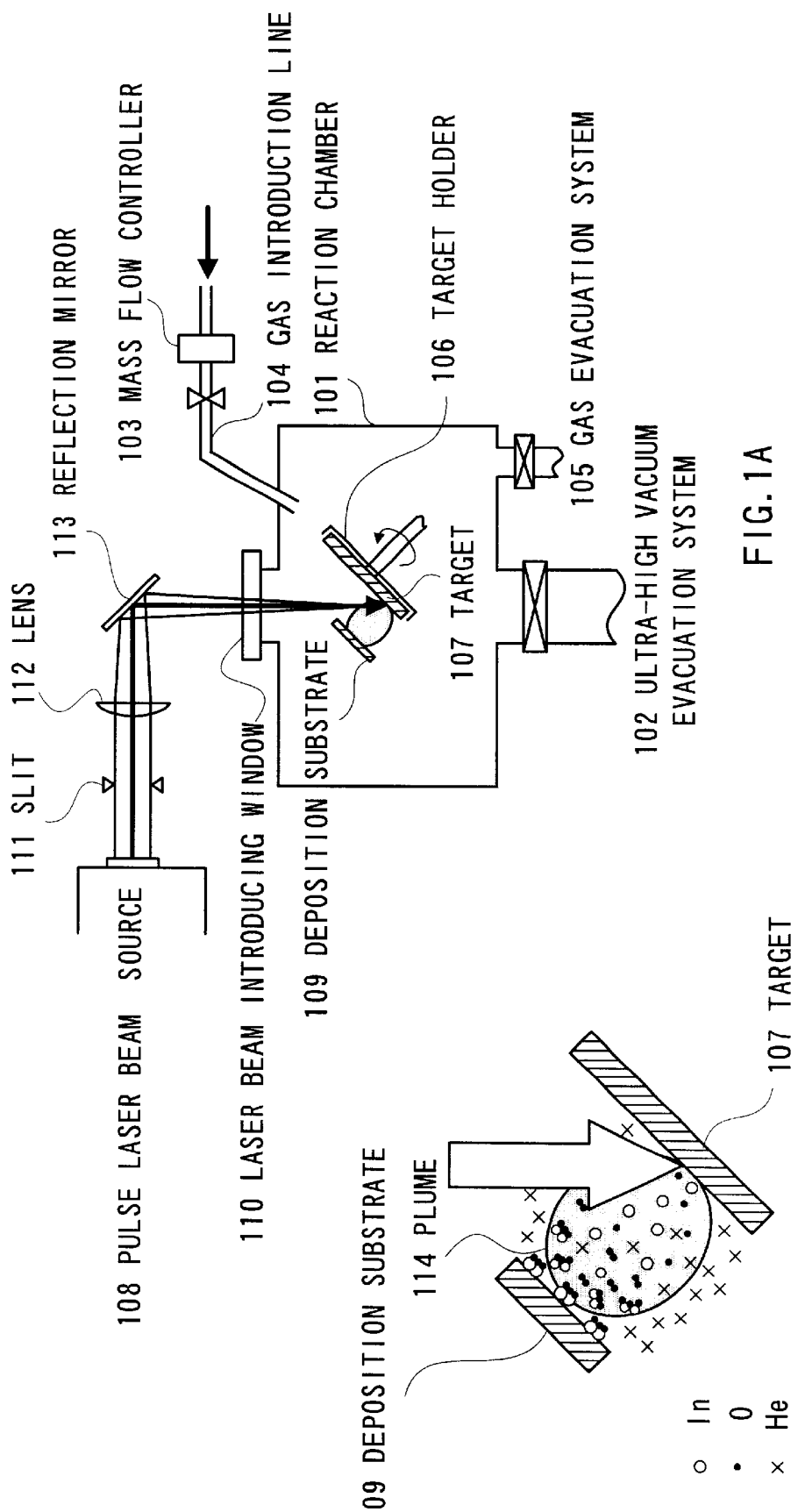
FIG. 1A is a configuration diagram illustrating a thin film formation apparatus for use in the present invention.
FIG. 1B is a diagram to explain a phenomenon caused between a deposition substrate and a target.

In FIG. 1A, reference mark 101 illustrates a reaction chamber in which a target is placed. Provided at a bottom of reaction chamber 101 is ultra-high vacuum evacuation system 102 which evacuates reaction chamber 101 to remove air and provide ultra-high vacuum therein. Attached at reaction chamber 101 is gas introduction line 104 which supplies an ambient gas to reaction chamber 101. Attached to gas introduction line 104 is mass flow controller 103 which controls a flow rate of the ambient gas supplied to reaction chamber 101. Further provided at the bottom of reaction chamber 101 is gas evacuation system 105 which evacuates the ambient gas therein.

Target holder 106 which holds target 107 is placed inside of reaction chamber 101. A rotation shaft is attached to target holder 106. Target 107 rotates by a rotation of the rotation shaft which is controlled a rotation control section that is not shown in the figure. Deposition substrate 109 is placed so as to being faced to a surface of target 107. Elements ejected from target 107 excited by an irradiation of a laser beam are deposited on deposition substrate 109. In addition, this case uses sintered polycrystal of $In_2O_3$ as a target material.

In the outside of reaction chamber 101, pulsed laser beam source 108 from which a laser beam is irradiated as energy beam to target 107 is placed. Laser beam introducing window which introduces the laser beam into reaction chamber 101 is attached to the upper side of reaction chamber 101. On an optical path, slit 111, lens 112 and reflection mirror 113 are placed in this order from laser beam source 108. The laser beam radiated from pulse laser beam source 108 is shaped by slit 111, focused by lens 112, reflected by reflection mirror 113, passed through laser beam introducing window 110 and irradiated to target 107 placed in reaction chamber 101.

Operations in the thin film formation apparatus configured as described above are explained. Reaction chamber 101 is evacuated by ultra-high vacuum evacuation system 102 having primarily a turbo molecular pump to required vacuum of $1.0 \times 10^{-9}$ Torr. Then helium(He) as is introduced from gas introduction line 104 through ass flow controller 103. At this point, a pressure of inert gas in reaction chamber 101 is set at a certain pressure value ranging from about 0.1 to 10 Torr by operating gas evacuation system 105 having primarily a dry rotary pump or a turbo molecular pump for high pressure in combination.

At this state, a laser beam is irradiated from pulse laser beam source 108 to a surface of sintered polycrystal of $In_2O_3$ with purity of 4N placed as a target 107 on target holder 106 with rotation mechanism. As pulse laser beam source 108, an argon-fluorine (ArF) excimer laser with wavelength of 193 nm, pulse width of 12 ns, energy density of 1 J/cm² and repetition rate of 10Hz was used. At this time, the laser ablation phenomenon occurs on the surface of $In_2O_3$ target 107, whereby ions and neutral particles (atom, molecule and cluster) such as In, O, InO and $In_2O_3$ are ejected from the surface. First, the ions have an kinetic energy of about 50 eV, while the neutral particles have an kinetic energy of about 5 eV. Both are ejected to a direction almost perpendicular to the target surface with volumes of molecule or cluster held. Then, by collisions with the ambient inert gas atoms directions of ejected species become disorderly, while kinetic energies thereof are scattered to the atmosphere, whereby ejected species are deposited as a homogeneous thin film on deposition substrate 109 which is away by 3 cm and faced to target 107. In addition, the temperatures of the substrate and target are not controlled intentionally.

In this example, He gas is used as a background gas, however other inert gases such as Ar and $N_2$ may be used. In this case, a pressure of such a gas is set so that the gas density becomes the same as in the case of He gas. For example, in the case where Ar with gas density of 1.78 g/l is used, the gas pressure is set to multiplied by 0.1 using He with gas density of 0.18 g/l as a reference.

With respect to indium oxide thin films formed on the deposition substrate by varying a pressure of He background gas according to the above-mentioned method, the film thickness, transmittance and resistivity thereof are evaluated. The evaluation results of each deposited thin film are shown in Table 1.

TABLE 1

Evaluation results of properties of thin films deposited in He background gas

| He gas pressure (Torr) | Film thickness (nm) | Transmittance* (%) | Surface Resistivity ($\Omega/\square$) | Volume Resistivity ($\Omega$cm) |
|---|---|---|---|---|
| UHV($\sim 10^{-6}$) | 450 | 8.1 | 35.2 | $1.58 \times 10^{-3}$ |
| 0.25 | 250 | 0.006 | 51.6 | $1.29 \times 10^{-3}$ |
| 0.50 | 250 | 0.13 | 71.9 | $1.80 \times 10^{-3}$ |
| 0.75 | 420 | 24.4 | $2.76 \times 10^2$ | $1.16 \times 10^{-2}$ |
| 1.00 | 380 | 94.1 | $6.88 \times 10^3$ | 0.261 |
| 2.00 | 370 | 96.6 | $3.91 \times 10^4$ | 1.44 |

*Transmittance at a wavelength of 550 nm

Figure 2:
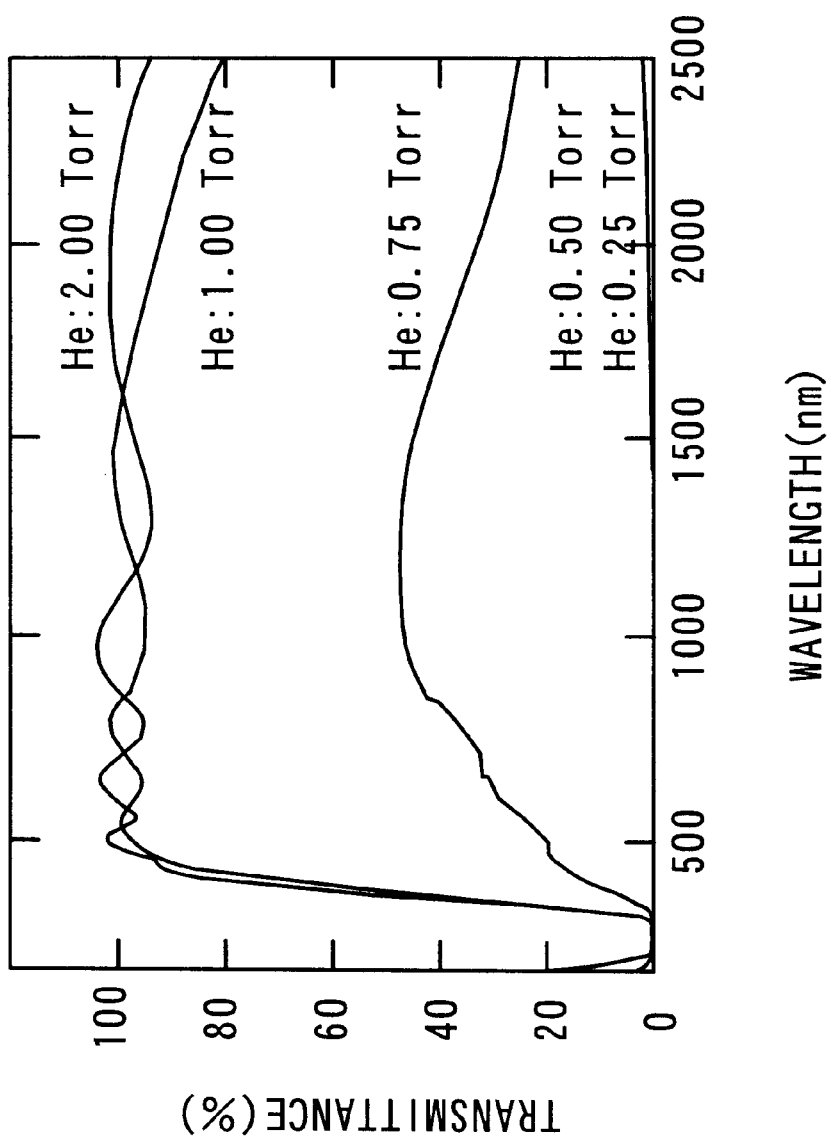
FIG. 2 is a graph showing optical transmission spectra for thin films obtained by a method according to a first embodiment of the present invention.

FIG. 2 illustrates optical transmission spectra of each deposition in a wavelength range of 200 to 2,500 nm. Samples which were formed under a He gas pressure of 0.5 Torr or less are high reflective films with almost 0% transmittance, while samples which were formed under He gas pressure of 1.0 Torr or more show a high transmittance of 80% or more, with variation of film reflection due to interference of thin film. As a transmittance in a visible range, transmittances at 550 nm are shown in Table 1.

Figure 3:
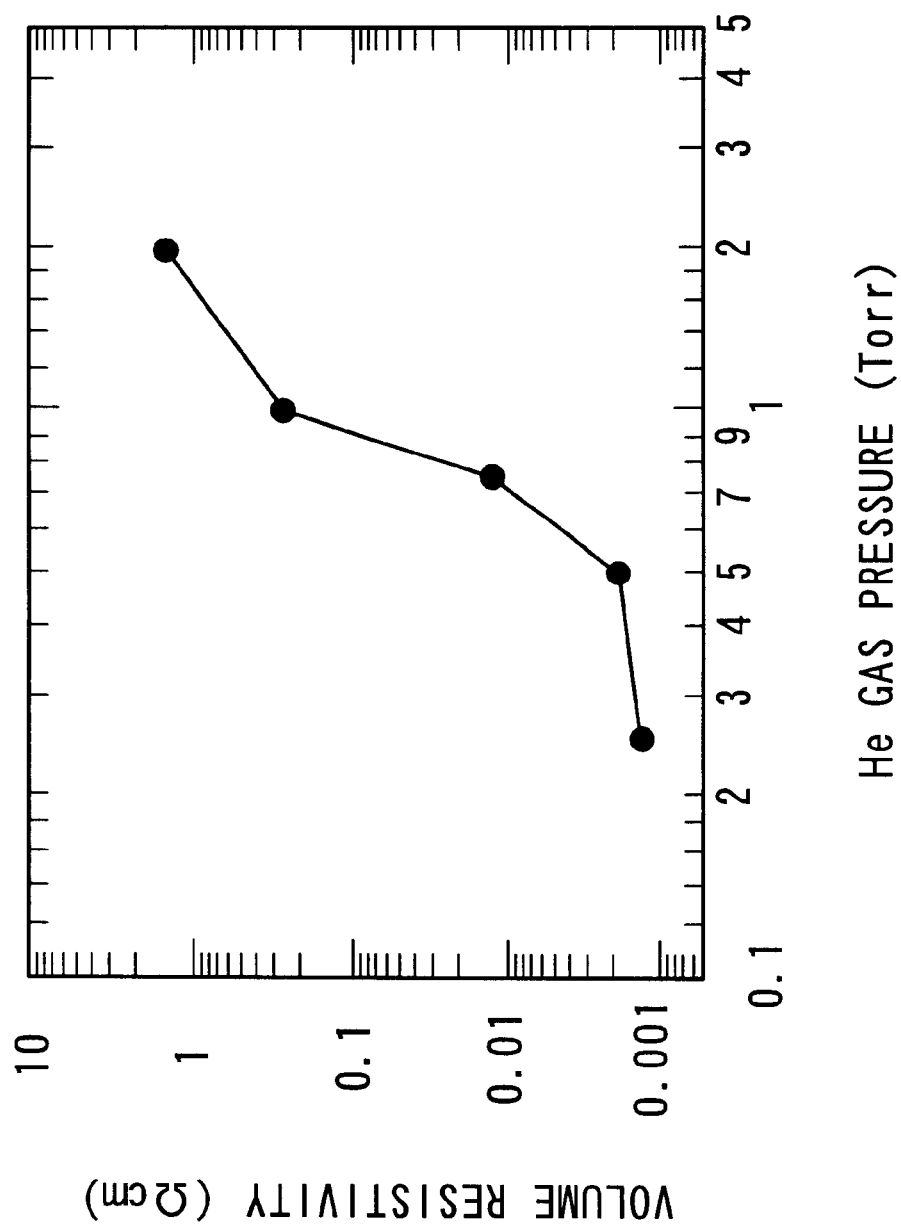
FIG. 3 is a graph showing a gas pressure dependence of volume resistivity of the thin film obtained by the method according to the first embodiment of the present invention.

He gas pressure dependence of volume resistivity at a center portion of a deposited film is shown in FIG. 3. Further, surface resistivity and volume resistivity of each sample are also shown in Table 1. The samples which were formed under a He gas pressure of 0.5 Torr or less each shows a volume resistivity in an order of $10^{-3}$ $\Omega$cm in the same manner as in a sample formed in an ultra-high vacuum, while samples which were formed under a higher He gas pressure than 0.5 Torr each shows a high resistivity, which becomes extremely higher as the He gas pressure is increased.

As described above, in this embodiment, the transmittance of the thin film formed in a He background gas is increased as the He gas pressures is increased, and extremely increased when the He gas pressure exceeds 1.0 Torr. On the other hand, with respect to electric properties, the resistivity of a deposited film shows a low value in an order of $10^{-3}$ $\Omega$cm when the He gas pressure is low, and is rapidly increased as the He gas pressure is increased.

It is necessary to provide a difference from a stoichiometric composition or a high carrier concentration due to additive impurities in order to provide a high conductivity to transparent conducting oxide thin film. A $In_2O_3$ film is inherently an insulator, and it is considered that an existence of oxygen deficiency introduces conductivity.

In a conventional vacuum deposition method, in the case where $In_2O_3$ is used as a vaporized material, it is considered that a vaporization and deposition of $In_2O_3$ are carried out according to a reaction expressed by the following equation:

$$In_2O_3(s) \leftrightarrows In_2O\ (g) + O_2(g) \qquad \text{eq.(1)}$$

However, when $O_2$ gas is not sufficiently supplied to a substrate surface to synthesize $In_2O_3$ on the substrate surface, In is deposited in a thin film according to the following equation (2):

$$3In_2O\ (g) \rightarrow In_2O_3(s) + 4In(s) \qquad \text{eq.(2)}$$

In this embodiment, the He gas pressure dependency of transmittance and resistivity of the deposited film show the same tendency as that of $O_2$ gas partial pressure dependency in the conventional vacuum deposition method. In other words, when the He gas pressure is low, In is deposited in the thin film due to a lack of oxygen, whereby obtaining blackish opaque films. As the He gas pressure is increased than 1.0 Torr, the transmittance is increased due to a suppression of the lack of oxygen, while the resistivity is also increased.

Figure 4:
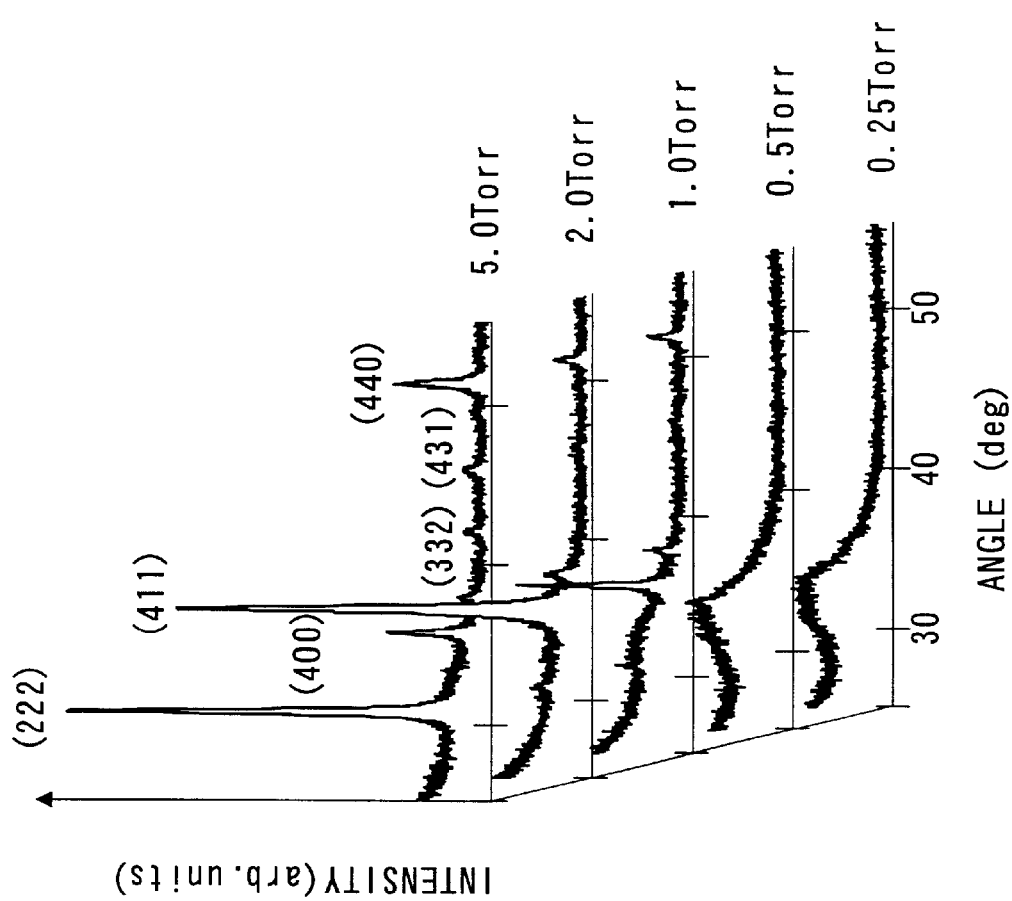
FIG. 4 is a graph showing a result of X-ray diffraction measurement of the film obtained by the method according to the first embodiment of the present invention.

FIG. 4 is a graph showing results of X-ray diffraction measurements of thin films formed under different He gas pressures. Samples which were formed under the He gas pressure of 0.5 Torr or less show a broad peak around a diffraction angle of 33°. This maximum position corresponds to (101) plane spacing of metal In, however since the peak is broad, it is considered that the structure is amorphous or an aggregate of ultrafine particles.

On the other hand, samples which were formed respectively under the He gas pressures of 1.0 Torr and 2.0 Torr show four diffraction peaks corresponding to a crystal structure of $In_2O_3$ in particular, a high orientation of (400). Further, a sample which was formed under the He gas pressure of 5.0 Torr shows seven diffraction peaks, and a ratio of an intensity of each peak of the sample is the same as that of a powder of standard sample, whereby it is understood that the structure of the sample has random orientation.

The above results show that it is possible to form an oxide thin film with no oxygen deficiency by controlling a pressure of ambient gas, even when the ambient gas is an inert gas containing no oxygen, in the oxide thin film formation method according to the thin film formation method of this embodiment. In other words, the above results show that it is possible to form a stoichiometric oxide thin film by optimizing mutual interactions such as collisions, scattering and a confinement effect between materials (primarily, atom, ion and cluster) ejected from a target material by an irradiation of laser beam and the inert gas.

The following description is given of the consideration of the effect of the ambient gas. The materials ejected from a surface of the target material by an irradiation of laser beam are not vaporized with the target composition maintained, but propagated while keeping linearity in a state of primarily atom or ion. However, in the case where the ambient gas is present, the materials lose energies by a collision with the gas or scattering by the gas, whereby a spatial distribution, deposition rate and distribution of kinetic energy of deposition material in the thin film formation vary. Such variations are different depending on a kind and kinetic energy of ejected material, and it is considered that a heavier material (In in this case) is apt not to be scattered, and thus tend to maintain the linearity. As a result, in the case where a thin film is formed under a low pressure of the ambient gas, materials reach a substrate with defects of oxygen which is apt to be scattered and has a high vapor pressure. Atoms and ions ejected from the target material move forward at respective inherent velocities first, and then receive collisions and scattering with/by the ambient gas largely, as a pressure of ambient gas is increased, and thereby the velocities thereof become slower and come close to equal rates to each other. As a result, as shown in FIG. 1B, the ejected materials are confined within plume 114, and outdiffusion of oxygen which is generated under a low pressure is suppressed. In the laser ablation in an inert ambient gas, such an effect is important because oxygen to be deposited on a thin film is only supplied from oxygen ejected from the target.

However, a rapid increase of transmittance as shown in FIG. 2 is not explained by an increase of an amount of oxygen to be supplied caused by a spatial confinement of oxygen. When the amount of oxygen to be supplied is increased, the transmittance is expected to be increased gradually in the same manner as in an increase of transmittance shown in FIG. 7.

When the laser ablation is performed under a high pressure of ambient gas, the ambient gas is compressed, and the pressure and temperature thereof are increased, thus resulting in a formation of shock front. An effect of the shock front in a formation of oxide will be considered next. An increase of pressure promotes a formation of $In_2O_3$ that is a reaction which decreases volume and the mole number of the system (reaction which goes to left in the equation (1)). An increase of temperature promotes an excitation of the irradiated material thermally. However, the formation of $In_2O_3$ is suppressed because a free energy of $In_2O_3$ formation is increased by such increase of temperature As the shock front goes forward and thereby a distance between the shock front and the target material is increased, the pressure and temperature are decreased. Further, the free energy of formation is decreased as the temperature is decreased. As a result, an area in which a high pressure condition and a high temperature condition where a sufficiently low free energy of formation is available are both achieved is formed at a distance from the target, and in this area, the oxidation is facilitated. In other words, it is considered that $In_2O_3$ in which the stoichiometric component is held in this facilitated oxidation region in the vapor phase, and thus a transparent thin film is formed on the substrate.

Further, with respect to crystallinity, the thin film formed on an unheated glass substrate according to a conventional production method has an amorphous structure. On the contrary, according to this embodiment, a thin film formed of crystalline $In_2O_3$ is obtained when a deposited film is formed on an unheated synthesized quartz substrate. Further, with respect to orientation, the samples which were formed under a He gas pressure of 1.0 to 2.0 Torr show the high orientation, while the sample which was formed under a He gas pressure of 5.0 shows no orientation. These results are explained as follows by a relationship of positions of the facilitated oxidation region generated by the shock front and the deposition substrate. Namely, a crystal nucleus of $In_2O_3$ is formed by a facilitation of oxidation in the facilitated oxidation region in the vapor phase, thereafter the crystal nucleus grows up to a crystallite by a rapid cooling accompanied by a further aviation thereof. When the deposition substrate is placed so as to come into contact with the facilitated oxidation region, a surface of the substrate becomes an active area, and the crystallites formed in the vapor phase are oriented by a migration on the substrate, thus resulting in a crystallization of $In_2O_3$. On the other hand, when the deposition substrate is placed outside of the facilitated oxidation region, since crystallites grown in the vapor phase reach the substrate while being aggregated, the thin film has a structure with no orientation. Under the process conditions according to this embodiment, it is considered that the deposition substrate is placed so as to come into contact with the facilitated oxidation region formed by the shock front under the He gas pressure ranging from about 1.0 to 2.0 Torr.

As described above, in the laser ablation, there is the relationship between an ambient gas pressure (P) and a distance between a target and a substrate (D). The species ejected from the target by an irradiation of laser beam forms a plasma state called plume. Since the plume is influenced by collisions with the ambient gas, the volume of the plume has the gas pressure dependency, and is decreased as the gas pressure becomes higher.

On the other hand, it is desired that conditions be set so that the previously mentioned facilitated oxidation region formed in the plume comes into contact with the substrate in order to obtain an oriented thin film. specifically, the distance D is 3 cm (D=3 cm) in this embodiment, and in this case, a oriented thin film is obtained under a condition that the pressure P is about 1.0 Torr (P=about 1.0 Torr). When the distance D is further increased, the plume should be increased, in other words, the gas pressure should be lowered. Further, the film quality of the deposited film largely depends on velocities ejected species from the target material, obtained when the ejected species reaches the substrate. Therefore, in order to obtain a uniform film quality, it is necessary to make the aforementioned velocity constant, and as a process condition to obtain such a velocity, there is a relationship that $PD^n$ is constant, where a value of n is 2 or 3. Accordingly, for example, in the case where the distance D is multiplied by 2, the gas pressure P becomes one-fourth to one-eighth the original.

As described above, in the thin film formation method of this embodiment, in the case where the laser ablation is carried out using a target material composed of elements containing an element with a high vapor pressure (oxygen in this case), a stoichiometric thin film is formed by forming a plume with a suitable volume is obtained by adjusting an ambient gas pressure and a distance between a target and a deposition substrate, in order to prevent the stoichiometry from being shifted by outdiffusion of the element with a high vapor pressure, which is replaced with a method of supplementing the element with a high vapor pressure using a gas containing the element with a high vapor pressure as an ambient gas. In other words, a thin film with almost the same composition as that in a target material is formed on the deposition substrate by suppressing the outdiffusion of the element with a high vapor pressure in the plume with a suitable volume. The plume with a suitable volume is constructed so that the facilitated oxidation region formed in the plume comes into contact with a surface of deposition substrate 109. Accordingly, in the thin film formation method according to this embodiment, an ambient gas pressure and a distance between a target and deposition substrate are properly set in order to enable the formation of such a plume with a suitable volume.

In this method, it is possible to control a crystallinity of a formed thin film and defects thereof by adjusting a pressure of the ambient gas, in other words, adjusting the number of collision times between ejected species from the target material and atoms of the ambient gas, thereby controlling a ratio of element with a high vapor pressure confined within a high temperature and high pressure region formed in a plume.

As described above, according to the thin film formation method of this embodiment, it is possible to form a stoichiometric oxide thin film without needing an introduction of oxygen gas and substrate heating. Accordingly, by use of this method, materials for the substrate on which a thin film is formed are not limited, and it is thereby possible to form a thin film on a substrate composed of organic materials with low heat resistance. Thus it is possible to form a transparent electrode for use in a display device such as a LCD device and an organic EL device.

Figure 5:
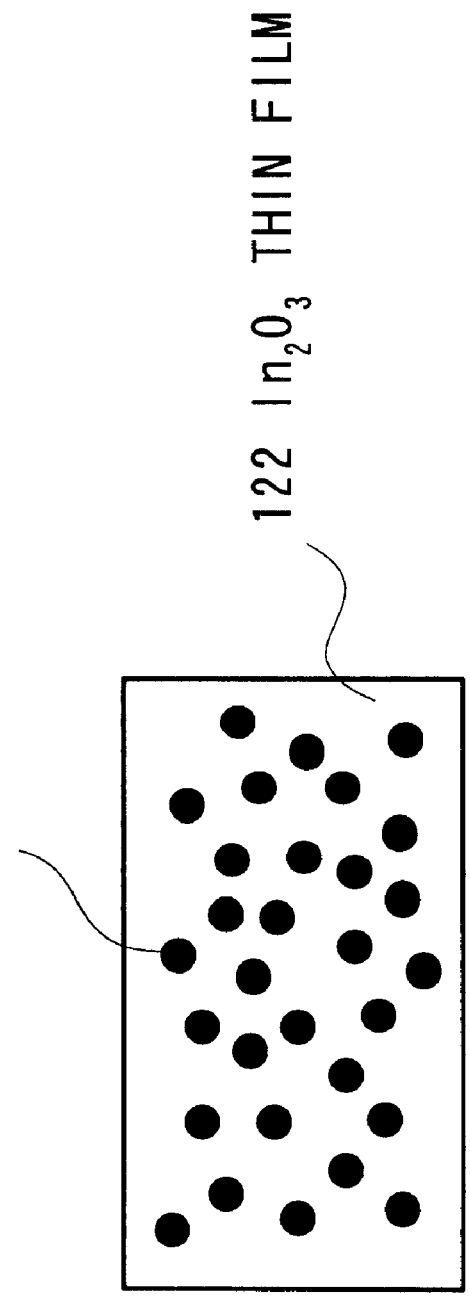
FIG. 5 is a diagram illustrating an optoelectronic material, obtained by using by the method according to the first embodiment of the present invention.

Further, according to the method of this embodiment, it is possible to adjust the adaptability of an anaerobic process. For example, in an optoelectronic material having a structure, as shown in FIG. 5, in which ultrafine particles composed of light-emitting semiconductor (for example, Si ultrafine particles) 121 are dispersed in a transparent conducting thin film (for example, $In_2O_3$ thin film) 122, it is possible to obtain such an optoelectronic material without causing the oxidization of Si ultrafine particles which are apt to be oxidized. The optoelectronic material with such a structure can be used as a light emission device or a photoelectric conversion device.

Figure 6:
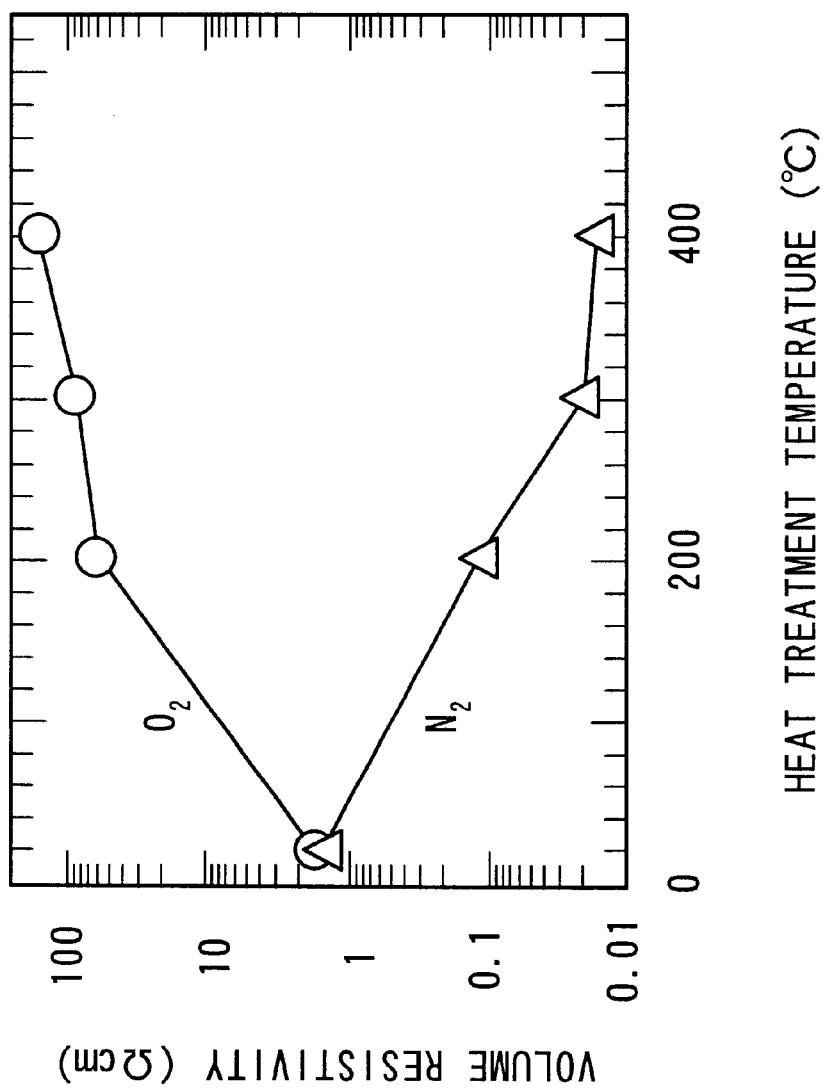
FIG. 6 is a graph showing a dependence on heat treatment temperature of volume resistivity of the thin film obtained by the method according to the first embodiment of the present invention.

In addition, a thin film immediately after the film formation sometimes results in problems such as poor crystallinity or defects. Further, it is sometimes necessary to adjust resistivity of a thin film obtained according to the above-mentioned method. In such cases, it is effective to oxidize the obtained thin film in an atmosphere of oxygen, and to anneal the obtained thin film in an atmosphere of nitrogen. As an example, FIG. 6 shows the annealing temperature dependency of volume resistivity of each of thin films composed of $In_2O_3$ which is formed under a He gas pressure of 2.0 Torr and annealed respectively in an atmosphere of $O_2$ gas or $N_2$ gas. As can be seen from FIG. 6, the resistivity of the thin film annealed in an atmosphere of $O_2$ gas is increased, while the resistivity of the thin film subjected to the heat processing in an atmosphere of $N_2$ gas is decreased, whereby it is possible to adjust resistivity in a range of $10^{-2}$ to $10^2$ Ωcm.

Further, the above explanation describes about a production method of a thin film composed of $In_2O_3$ which is two-dimensional transparent conducting oxide thin film, however it may be possible to use other oxide such as $SnO_2$, ZnO, $TiO_2$ and $WO_3$ as a material for the thin film. Further, it may be possible to use three-dimensional material such as ITO and $CuAlO_2$ or oxides of four-dimensional or more system. Furthermore, the method according this embodiment may be applicable to materials with elements with a high vapor pressure and nitride in the same manner as in this embodiment.

Second Embodiment

A thin film formation method according to this embodiment will be described in detail below with reference to FIG. 7 and FIG. 8.

This embodiment describes about a method of forming a transparent conducting oxide thin film. In this embodiment, a material composed of transparent conducting oxide is deposited on a substrate using a laser ablation in an atmosphere of a mixed gas of an inert gas such as Ar and He and an oxidizing gas such as $O_2$, $O_3$, $N_2O$ and $NO_2$. In this case, the oxidizing gas is mixed to the inert gas in a mixed ratio of 50% by volume or less.

In this embodiment, in the same way as in the first embodiment, a homogeneous transparent conducting oxide thin film is formed by using an excimer laser or a YAG laser with harmonic wave as a light source, using a thin film formation apparatus illustrated in FIG. 1A, and performing the laser ablation with a homogeneous transparent conducting oxide as a target material. Reaction, chamber 101 is evacuated by ultra-high vacuum evacuation system 102 having primarily a turbo molecular pump to a required vacuum of $1.0 \times 10^{-9}$ Torr. Then, a mixed gas of He gas and $O_2$ gas (1% by volume) is introduced from gas introduction line 104 through mass flow controller 103. At this point, a pressure of the mixed gas in reaction chamber 101 is set at a certain pressure value ranging from about 0.1 to 10 Torr (partial pressure of $O_2$ gas is approximately 1.0 to 100 mTorr) by operating gas evacuation system 105, having primarily a dry rotary pump or a turbo molecular pump for high pressure, in combination.

At this state, a laser beam is irradiated from pulse laser beam source 108 to a surface of sintered polycrystal of $In_2O_3$ with purity of 4N placed as target 107 on target holder 106 with rotation mechanism. As pulse laser beam source 108, an ArF excimer laser with wavelength of 193 nm, pulse width of 12 ns, energy density of 1J/cm$^2$ and repetition rate of 10 Hz is used.

At this time, the laser ablation phenomenon occurs on the surface of $In_2O_3$ target 107, whereby ions and neutral particles (atom, molecule and cluster) such as In, O, InO and $In_2O_3$ are ejected from the surface. First, the ions have an kinetic energy of about 50 eV, while the neutral particles have an kinetic energy of about 5 eV. Both are ejected to a direction almost perpendicular to the target surface with volumes of molecule or cluster held. Then, by collisions with the ambient gas atoms, directions of ejected species become disorderly, while kinetic energies thereof are dissipated to the atmosphere, whereby ejected species are deposited as a homogeneous thin film on deposition substrate 109 which is faced to target 107 with a distance therebetween of 3 cm. In addition, the temperatures of the substrate and target are not controlled intentionally.

In this example, a mixed gas of He gas and $O_2$ gas is used as a background gas, however other inert gases such as Ar, Kr and Xe may be used instead of He gas, and other oxidizing gases such as $O_3$, $N_2O$ and $NO_2$ may be used instead of $O_2$ gas. In this case, a pressure of a mixed gas is set so that the average gas density becomes the same as in the case of a mixed gas of He gas and $O_2$ gas. With respect to indium oxide thin films formed on the deposition substrate by varying a pressure of He background gas according to the above-mentioned method, the film thickness, transmittance and resistivity thereof were evaluated. The evaluation results of each deposited thin film are shown in Table 2.

TABLE 2

Evaluation results of properties of thin films deposited in background gases containing oxidizing gas

| He/$O_2$ gas pressure (Torr) | Film thickness (nm) | Transmittance* (%) | Surface Resistivity ($\Omega/\square$) | Volume Resistivity ($\Omega$cm) |
|---|---|---|---|---|
| UHV(~10$^{-6}$) | 450 | 8.1 | 35.2 | 1.58 × 10$^{-3}$ |
| 0.25 | 560 | 5.35 | 3.07 × 10$^3$ | 0.172 |
| 0.50 | 490 | 71.6 | 31.3 | 1.53 × 10$^{-3}$ |
| 0.75 | 380 | 88.1 | 5.56 × 10$^2$ | 2.11 × 10$^{-2}$ |
| 1.00 | 370 | 95.1 | 3.54 × 10$^6$ | 131 |

*Transmittance at a wavelength of 550 nm

Figure 7:
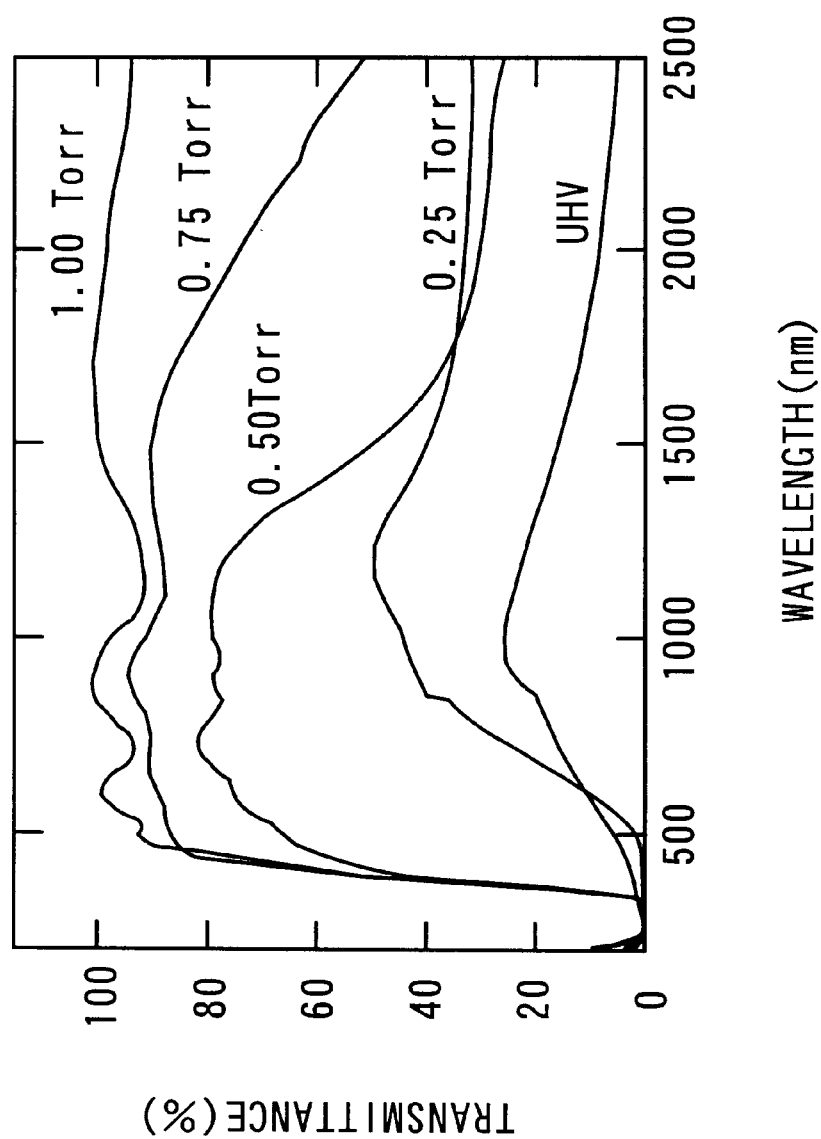
FIG. 7 is a graph showing optical transmission spectra of a thin film obtained by a method according to a second embodiment of the present invention.

FIG. 7 illustrates optical transmission spectra of each deposited film in a wavelength range of 200 to 2,500 nm. As a background gas pressure is increased, the transmittance is gradually increased, and a transparent wavelength range becomes broad to a shorter wavelength. Samples which were formed under a gas pressure of 0.75 Torr or more show a high transmittance of 80% or more, with variation of film reflection due to interference of thin film. As a transmittance in a visible range, transmittances at 550 nm are shown in Table 1.

Figure 8:
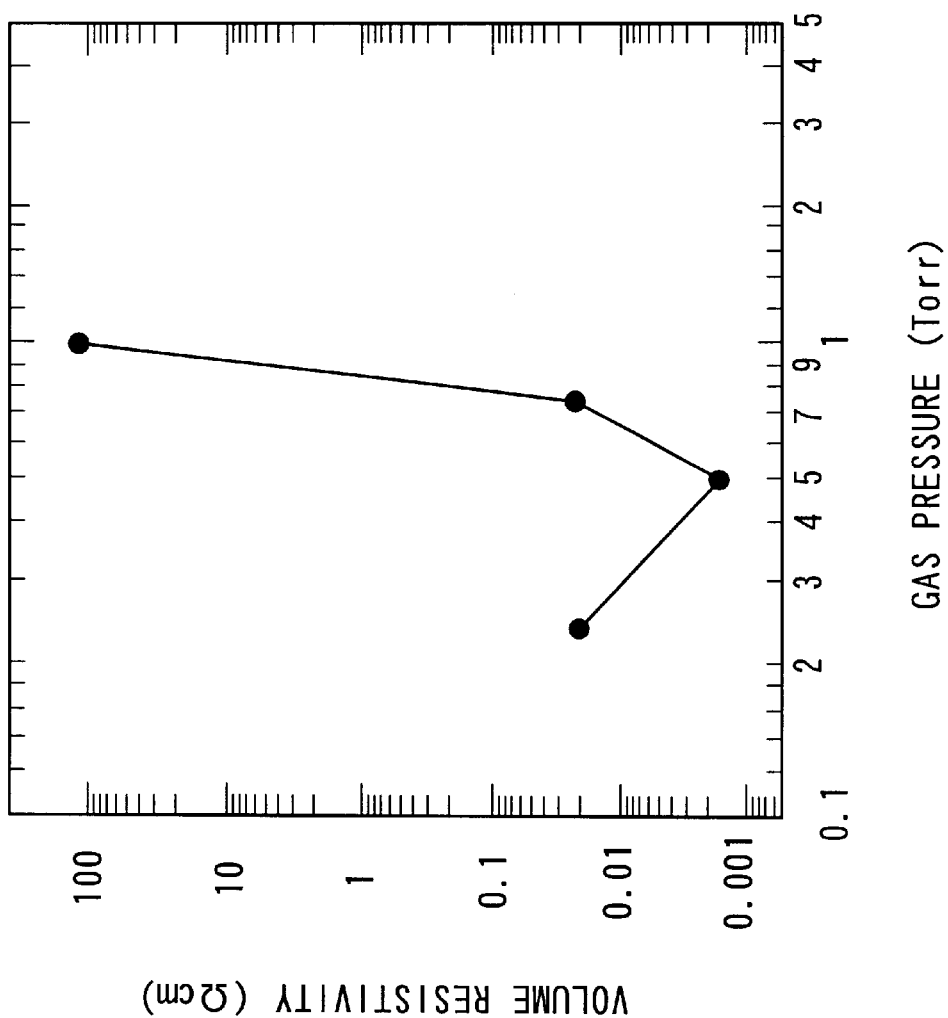
FIG. 8 is a graph showing a gas pressure dependence of volume resistivity of the thin film obtained by the method according to the second embodiment of the present invention.

The gas pressure dependence of volume resistivity at a center portion of a deposited film is shown in FIG. 8. Further, surface resistivity and volume resistivity of each sample are also shown in Table 2. In the case of the sample which was formed under a gas pressure of 0.25 Torr, the sample formed in an atmosphere of the mixed gas containing oxidizing gas shows high resistivity, while the sample formed in an atmosphere of only He gas shows low resistivity (refer to FIG. 3). On the other hand, the sample formed under a gas pressure of 0.5 Torr shows the least resistivity of $1.53 \times 10^{-3}$ $\Omega$cm. In other words, it is considered that an optimal gas pressure to obtain lower resistivity is present in the thin film formation in an atmosphere of a mixed gas containing an oxidizing gas.

As described above, in this embodiment, the transmittance of the thin film formed in an atmosphere of the mixed gas of He gas and $O_2$ gas is increased as the gas pressure is increased, and under a gas pressure of 1.0 Torr or more, thin films with extremely high transmittance are obtained. In other words, with respect to electric property, the resistivity of the deposited thin film formed under a gas pressure of about 0.5 Torr shows the minimum value.

The above results show that in the formation of oxide thin film by the thin film formation method according to this embodiment, an amount of oxygen deficiency can be controlled by controlling a gas pressure in a reaction chamber using an inert gas containing no oxygen, and by an effect of $O_2$ gas which is slightly contained in the atmosphere. In other words, the above result show that species from a target material by an irradiation of a laser beam (primarily atoms, ions and cluster) reach the substrate via physical interaction with inert gas and via chemical interaction with oxygen gas, and that a stoichiometric oxide thin film is formed. Further, it is considered that $O_2$ molecules contained in the ambient gas are decomposed by an irradiation of excimer laser beam and become active O atom or ion, so that the oxidation of ejected species from the target material is promoted.

In addition, as described in the first embodiment, in the laser ablation, there is the relationship between an ambient gas pressure (P) and a distance between a target and a substrate (D). Specifically, the distance D is 3 cm (D=3 cm) in this embodiment, and in this case, an oriented thin film is obtained under a condition that the pressure P is about 1.0 Torr (P=about 1.0 Torr). When the distance D is further increased, the plume should be increased, in other words, the gas pressure should be lowered. Further, the film quality of the deposited thin film largely depends on a velocity at which an ejected species from the target material reaches the substrate. Therefore, in order to obtain a uniform film quality, it is necessary to make the aforementioned velocity constant, and as a process condition to obtain such a velocity, there is a relationship that PD$^n$ is constant, where a value of n is considered to be 2 or 3. Accordingly, for example, in the case where the distance; D is multiplied by 2, the gas pressure P becomes one-fourth to one-eighth the original.

In addition, a thin film immediately after the film formation sometimes results in problems such as poor crystallinity or defects. Further, it is sometimes necessary to adjust resistivity of a thin film obtained according to the above-mentioned method. In such cases, it is effective to oxidize the deposited thin film in an atmosphere of oxygen, or to anneal the deposited thin film in an atmosphere of nitrogen.

Further, the above explanation describes about a production method of a thin film composed of $In_2O_3$ which is two-dimensional transparent conducting oxide thin film, however it may be possible to use other oxide such as $SnO_2$, ZnO, $TiO_2$ and $WO_3$ as a material for the thin film. Still furthermore, it may be possible to use three-dimensional material such as ITO and CuAlO$_2$ or oxides of four-dimensional or more system. Furthermore, the method according this embodiment may be applicable to nitride in the same manner as in this embodiment. In this case, N$_2$ gas is used instead of O$_2$ gas.

Third Embodiment

A thin film formation method according to this embodiment will be described in detail below with reference to FIG. 9.

This embodiment describes about a method of producing method of optoelectronic material having a structure in which ultrafine particles of semiconductor are dispersed in a transparent conducting oxide. In this embodiment, a semiconductor material and a material composed of transparent conducting oxide are deposited on a substrate at the same time using a laser ablation in an inert background gas such as Ar and He.

In this embodiment, in the same way as in the first embodiment, an optoelectronic material in which ultrafine particles of semiconductor are dispersed in a transparent conducting oxide by using an excimer laser or a YAG laser with harmonic wave as a light source, using a thin film formation apparatus illustrated in FIG. 1A, and performing the laser ablation with a combined target material of Si which is an element belonging to the IV group of the periodic table and used as a semiconductor material and In$_2$O$_3$ which is a transparent conducting oxide.

Reaction chamber 101 is evacuated by ultra-high vacuum evacuation system 102 having primarily a turbo molecular pump to a required vacuum of $1.0 \times 10^{-9}$ Torr. Then, lie gas is introduced from gas introduction line 104 through mass flow controller 103. At this point, a pressure of the gas in reaction chamber 101 is set at a certain pressure value ranging from about 0.1 to 10 Torr by operating gas evacuation system 105, having primarily a dry rotary pump or a turbo molecular pump for high pressure, in combination. At this state, a laser beam is irradiated from pulse laser beam source 108 to a surface of target 107 placed on target holder 106 with rotation mechanism. As pulse laser beam source 108, an argon-fluoride (ArF) excimer laser with wavelength of 193 nm, pulse width of 12 ns, energy density of 1J/cm$^2$ and repetition rate of 10 Hz is used.

Figure 9:
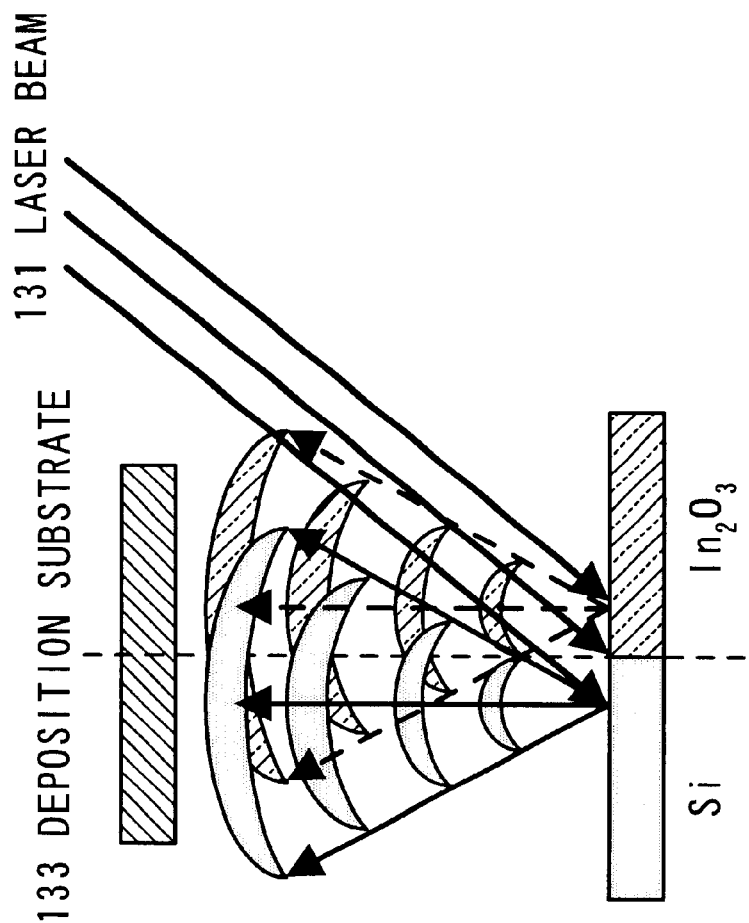
FIG. 9 is a diagram to explain a concept of a simultaneous deposition in a method according to a third embodiment of the present invention.

A method of irradiating a target with laser beam is next explained using FIG. 9. In FIG. 9, target 132 is obtained by combining Si and In$_2$O$_3$ with both materials contacted. For example, such a target is produced by sticking a Si wafer on a target of sintered polycrystal of In$_2$O$_3$. When laser beam 131 is irradiated to a boundary of Si and In$_2$O$_3$ on the target, ions and neutral particles (atom, molecule and cluster) such as Si, In, O, InO and In$_2$O$_3$ are ejected from the surface of the target. First, the ions have an kinetic energy of about 50 eV, while the neutral particles have an kinetic energy of about 5 eV. Both are ejected to a direction almost perpendicular to the target surface. Then, by collisions with the ambient gas, directions of ejected species become disorderly, while kinetic energies thereof are dissipated to the atmosphere, whereby ejected species are deposited on deposition substrate 133 which is faced to target 132 with a distance therebetween of 3 cm. In addition, the temperatures of the substrate and target are not controlled intentionally. In the case of this embodiment, the phenomenon described in the first embodiment is considered to be caused in a formation of thin film.

In this example, He gas is used as a background gas, however other inert gases such as Ar, Kr, Xe and N$_2$ may be used. In this case, a pressure of such a gas is set so that the average gas density becomes the same as in the case of He gas.

The optoelectronic material deposited on a deposition substrate according to the above-mentioned method has a structure, as shown in FIG. 5, in which Si ultrafine particles 121 are dispersed in In$_2$O$_3$ thin film 122. The reason for this is that since a standard formation enthalpy of In$_2$O$_3$ is lower than that of Si, Si grows as ultrafine particles without being oxidized, and thereby substances are deposited with each target composition held. The optoelectronic material with such a structure is used as a light-emitting device or a photoelectric conversion device.

In addition, an optoelectronic material composed of Si ultrafine particles and In$_2$O$_3$ thin film immediately after being deposited sometimes results in problems such as poor crystallinity or defects. In this case, it is effective to oxidize the deposited optoelectronic material in an atmosphere of oxygen, or to anneal the deposited optoelectronic material in an atmosphere of nitrogen, in order to improve film qualities such as crystallinity and purity.

Further, in this embodiment, Si is used as a material for ultrafine particles, however it may be possible to use other semiconductor materials belonging to the IV group such as Ge and C. Furthermore, a thin film of In$_2$O$_3$ is used as a transparent conducting material, however other transparent conducting materials such as SnO$_2$, ZnO, TiO$_2$ and WO$_3$ may be used.

Fourth Embodiment

A thin film formation method according to this embodiment will be described in detail below.

The thin film formation method according to the present invention is applicable to a formation of a functional thin film such as a ferroelectric thin film. This embodiment thus describes about a method of forming a ferroelectric thin film. In this embodiment, a ferroelectric material is deposited on a substrate using a laser ablation in an inert background gas such as Ar and He.

In this embodiment, in the same way as in the first embodiment, a homogeneous ferroelectric material is formed by using an excimer laser or a YAG laser with harmonic wave as a light source, using a thin film formation apparatus illustrated in FIG. 1A, and performing the laser ablation with a ferroelectric material as a target material. Reaction chamber 101 is evacuated by ultra-high vacuum evacuation system 102 having primarily a turbo molecular pump to a required vacuum of $1.0 \times 10^{-9}$ Torr. Then, a He gas is introduced from gas introduction line 104 through mass flow controller 103. At this point, a pressure of the inert gas in reaction chamber 101 is set at a certain pressure value ranging from about 0.1 to 10 Torr by operating gas evacuation system 105, having primarily a dry rotary pump or a turbo molecular pump for high pressure, in combination.

At this state, a laser beam is irradiated from pulse laser beam source 108 to a surface of sintered polycrystal of PbZrTiO$_3$ (PZT) placed as target 107 on target holder 106 with rotation mechanism. As pulse laser beam source 108, an argon-fluoride (ArF) excimer laser with wavelength of 193 nm pulse width of 12 ns, energy density of 1 J/cm$^2$ and repetition rate of 10 Hz is used. At this time, the laser ablation phenomenon occurs on the surface of PZT target 107, whereby ions and neutral particles (atom, molecule and cluster) are ejected from the surface. First, the ions have an kinetic energy of about 50 eV, while the neutral particles have an kinetic energy of about 5 eV. Both are ejected to a direction almost perpendicular to the target surface with volumes of molecule or cluster held. Then, by collisions with the ambient gas, ejection directions of ejected species become disorderly, while kinetic energies thereof are dissipated to the atmosphere, whereby ejected species are deposited as a homogeneous thin film on deposition substrate 109 which is faced to target 107 with a distance therebetween of 3 cm. In addition, the temperatures of the substrate and target are not controlled intentionally.

In this example, He gas is used as a background gas, however other inert gases such as Ar, Kr, Xe and N2 may be used instead of He gas. In this case, a gas pressure is set so that the gas density becomes the same as in the case of He gas. For example, in the case where Ar with gas density of 1.78 g/l is used as a background gas, the gas pressure is set to be multiplied by 0.1 using He with gas density of 0.18 g/l as a reference. Further, it may be possible to add an oxidizing gas such as $O_2$, $O_3$, $N_2O$ and $NO_2$ to the ambient gas as in the second embodiment.

The crystallinity of formed PZT thin film with a thickness of 200 nm was evaluated by X-ray diffraction measurement. The evaluation results show that when a He gas pressure is 1.0 Torr or more, a diffraction peak corresponding to (001) surface of a perovskite PZT crystal is observed, whereby it is understood that an oriented PZT film is obtained with the stoichiometry held.

In order to make a thinner film, a formation of PZT thin film with a thickness of 100 nm was examined. The crystallinity of the formed PZT thin layer was evaluated by X-ray diffraction measurement. The evaluation results show a diffraction peak corresponding to perovskite PZT crystal structure is observed, whereby it is confirmed that the crystallinity is obtained in a thin film with a thickness of 100 nm.

In this embodiment, a film quality of a deposited film shows the same tendency as that of $O_2$ gas partial pressure dependency in the conventional production method. In other words, when the He gas pressure is low, a film with lack of Pb and O each with high vapor pressure among from component materials of PZT. As the He gas pressure is increased than 1.0 Torr, such lack are suppressed, and a stoichiometric thin film is obtained.

The above results show that in the formation of ferroelectric thin film by the thin film formation method according to this embodiment, the ferroelectric thin film with no deficiency of Pb and O was able to be deposited by controlling an ambient gas even using an inert gas containing no oxygen. In other words, the above result show that as described in the first embodiment, it is possible to form an oriented ferroelectric thin film by optimizing the interaction such as collision, scattering and confinement effect between species ejected from a target material by an irradiation of a laser beam (primarily atoms, ions and cluster) and the inert gas.

In addition, as described in the first embodiment, in the laser ablation, there is the relationship between an ambient gas pressure (P) and a distance between a target and a substrate (D). Specifically, the distance D is 3 cm (D=3 cm) in this embodiment, and in this case, a stoichiometric thin film is obtained under a condition that the pressure P is about 1.0 Torr (P=about 1.0 Torr). When the distance D is further increased, the plume should be increased, in other words, the gas pressure should be lowered. Further, the film quality of the deposited thin film largely depends on a velocity at which an ejected species from the target material reaches the substrate. Therefore, in order to obtain a uniform film quality, it is necessary to make the aforementioned velocity constant, and as a process condition to obtain such a velocity, there is a relationship that $PD^n$ is constant, where a value of n is considered to be 2 or 3. Accordingly, for example, in the case where the distance D is multiplied by 2, the gas pressure P becomes one-fourth to one-eighth the original.

In addition, a thin film immediately after the film formation sometimes results in problems such as poor crystallinity or defects. In this case, it is effective to oxidize the deposited thin film in an atmosphere of oxygen, or to anneal the deposited thin film in an atmosphere of nitrogen, in order to improve film qualities such as crystallinity and purity.

Further, the above explanation describes about a formation method of a PZT thin film, however it may be possible to use other ferroelectric material such as $SrBi_2Ta_2O_9$ (SBT), $BaTiO_3$ and $Bi_4Ti_3O_{12}$ as a material for the thin film.

Fifth Embodiment

A fundamental configuration of a nonvolatile random access memory with a ferroelectric thin film according to the present invention will be described in detail with reference to FIG. 10.

In this embodiment, a ferroelectric memory with a PZT thin film will be described. The ferroelectric memory functions as a memory by using the hysteresis property thereof The ferroelectric thin film holds two stable states which depend on a polarity of an applied electric field even after the applied electric filed is removed. The rewrite of data is carried out by inverting a state of the ferroelectric thin film by applying an electric field of which the level is higher than the coercive electric filed of the ferroelectric thin film. The read of data is carried out by detecting a difference between residual polarization amounts of "1" and "0". At this point, a ferroelectric capacitor which carries out the rewrite and read of data is driven by MOSFET (Metal Oxide Semiconductor Field Effect Transistor), thus a memory cell is composed of the ferroelectric capacitor and MOSFET for driving the capacitor.

Figure 10:
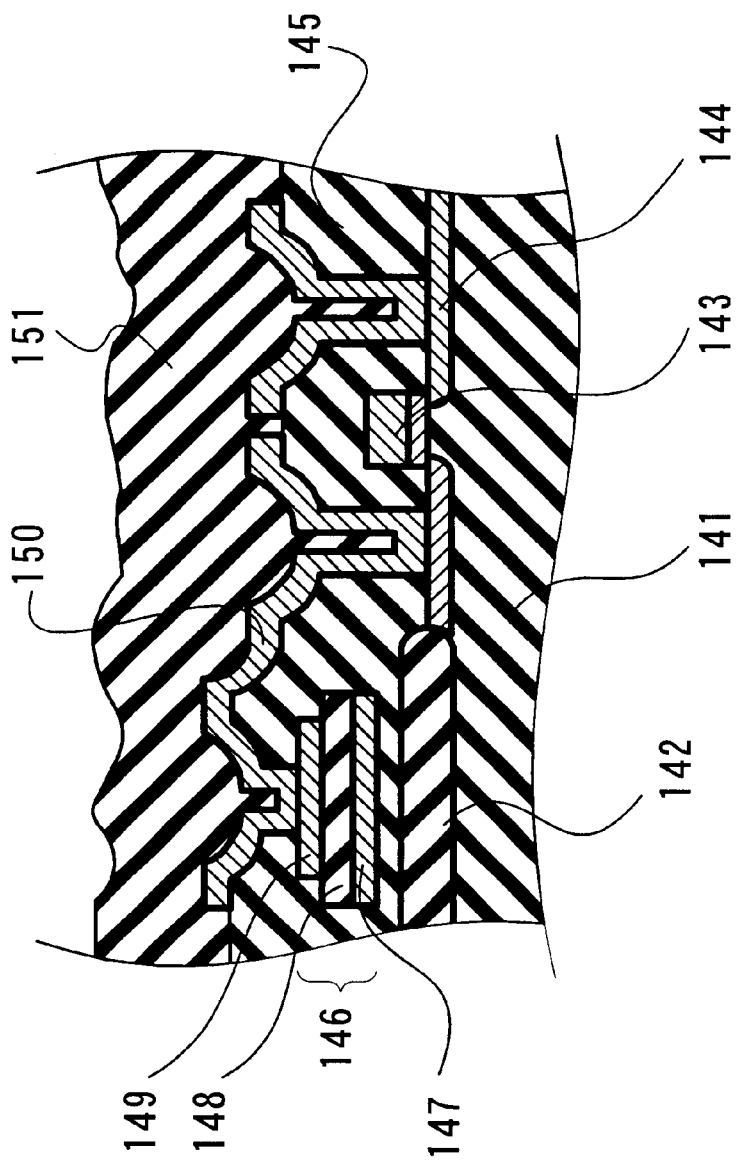
FIG. 10 is a sectional view showing a cell structure of a ferroelectric memory according to a fifth embodiment of the present invention.

FIG. 10 is a sectional view of a cell structure of the ferroelectric memory. In FIG. 10, reference mark 141 denotes a p-type Si substrate. On p-type Si substrate 141, isolation insulating film 142 which isolates each element is provided by the thermal oxidation. Word line 143 is formed in a MOSFET area. This word line 143 is composed of high density $n^+$ diffusion polysilicon layer formed on a gate oxide film. Further, high density $n^+$ diffusion layer 144 which functions as source and drain of MOSFET. High density $n^+$ diffusion layer 144 is formed by doping As or the like on Si substrate 141 in a high density. Layer-insulating film 145 is formed on the MOSFET. This layer-insulating film 145 is composed of $SiO_2$ film which is formed by a CVD method. Further, ferroelectric capacitor 146 is provided. This ferroelectric capacitor 146 is composed of a Pt thin film as a lower electrode 147, a PZT thin film that is ferroelectric thin film 148, and a Pt thin film as an upper electrode 149.

Upper electrode 149 of ferroelectric capacitor 146 is electrically connected to high density $n^+$ diffusion layer 144 by Al wiring 150 as a bit line. Silicon nitride film 151 is formed on Al wiring 150 as a protection film.

In the configuration as described above, when PZT thin film 148 that is the ferroelectric thin film is formed, the capacitor property thereof deteriorates when deficiencies of oxygen and lead occur. Then, a conventional production method requires an introduction of oxygen and a substrate heating to 600° C. or more in a film formation process in order to obtain a stoichiometric thin film. However, such a process with high temperature in oxygen background gas introduces a reaction of electrode materials and an unfavorable redistribution of a dopant profile formed in p-type Si substrate 141.

It is generally known that when the treatment temperature of a thin film exceeds a temperature obtained by multiplying the melting point thereof (absolute temperature) by 0.6, the aggregation due to the surface diffusion in a particle boundary rapidly occurs, whereby the film quality deteriorates. For example, since the melting point of $Pt_2Si$ is 1,100° C., the deterioration thereof occurs when the treatment temperature exceeds 550° C. Accordingly, the temperature of a ferroelectric thin film formation process should be set under 550 C. or less.

Therefore, a PZT thin film with a thickness of 200 nm is formed at a room temperature using the thin film formation method described in the fourth embodiment as a method of forming PZT thin film 148 that is the ferroelectric thin film. In this case, it is possible to obtain a (001)-oriented stoichiometric thin film in a process with no oxygen introduction at a room temperature, thus enabling the formation of the ferroelectric memory with no above-mentioned problems caused.

Further, the film formation is carried out at a room temperature herein, however it may be possible to heat a substrate to a temperature of 500° C. or less in order to improve the crystallinity. In addition, a thin film immediately after the film formation sometimes results in problems such as poor crystallinity or defects. In this case, it is effective to oxidize the deposited thin film in oxygen background gases, or to anneal the deposited thin film in nitrogen background gases. The electrode materials or the dopant profile in the substrate do not deteriorate when the annealing temperature is set at a temperature of 500° or less.

Furthermore, the conventional process with a high temperature in oxygen background gases for forming a ferroelectric thin film limits a high integration of the ferroelectric memory. It is principally possible to provide the ferroelectric memory with the high integration with a level equal to that of DRAM (Dynamic Random Access Memory), however there is a problem concerning the adaptability to a silicon process in order to integrate the ferroelectric materials on a semiconductor. Namely, when the design rule is improved to a level of 0.25 μm from a conventional level of 0.6 to 1.2 μm in order to achieve a highly integrated ferroelectric memory, it is necessary to produce CMOS as a driving circuit at a lower temperature, thus it is inevitable to carry out a ferroelectric thin film formation process at a temperature of 600° C. or less. Since it is possible to form a ferroelectric thin film at a temperature of 500° C. or less that is a relatively low temperature in this embodiment, the present invention is applicable to the design rule with the level of 0.25 μm.

When CMOS is formed in the design rule with the level of 0.25 μm, a driven voltage therefor is lowered to 1.8V. Hence, in order to decrease a coercive voltage of a ferroelectric thin film, a thin film with a thickness of about 100 nm is required. With respect to this requirement, as described in the fourth embodiment, according to the thin film formation method of the present invention, it is confirmed that a crystalline PZT thin film with a thickness of 100 nm can be obtained, thus enabling the matching to the design rule with the level of 0.25 μm.

Further, the above explanation describes about a ferroelectric memory using a PZT thin film, however it may be possible to use other ferroelectric material such as $SrBi_2Ta_2O_9$ (SBT), $BaTiO_3$ and $Bi_4Ti_3O_{12}$ as a material for the ferroelectric thin film.

Sixth Embodiment

A fundamental configuration of a nonvolatile random access memory with a ferroelectric thin film according to the present invention will be described in detail with reference to FIG. 11 and FIG. 12.

In this embodiment, a ferroelectric memory matching the design rule with the level of 0.25 μm will be described. FIG. 11 is a sectional view of cell structure of the ferroelectric memory. A basic configuration of the memory cell is composed of a ferroelectric capacitor and a MOSFET for driving the capacitor, and constructed in a stack type configuration in which cells are made three-dimensionally to obtain the high integration, while having MOSFET matching the 0.25 μm level. According to such a configuration, it is possible to reduce a cell size by about 50% as compared to a conventional planer type memory.

Figure 11:
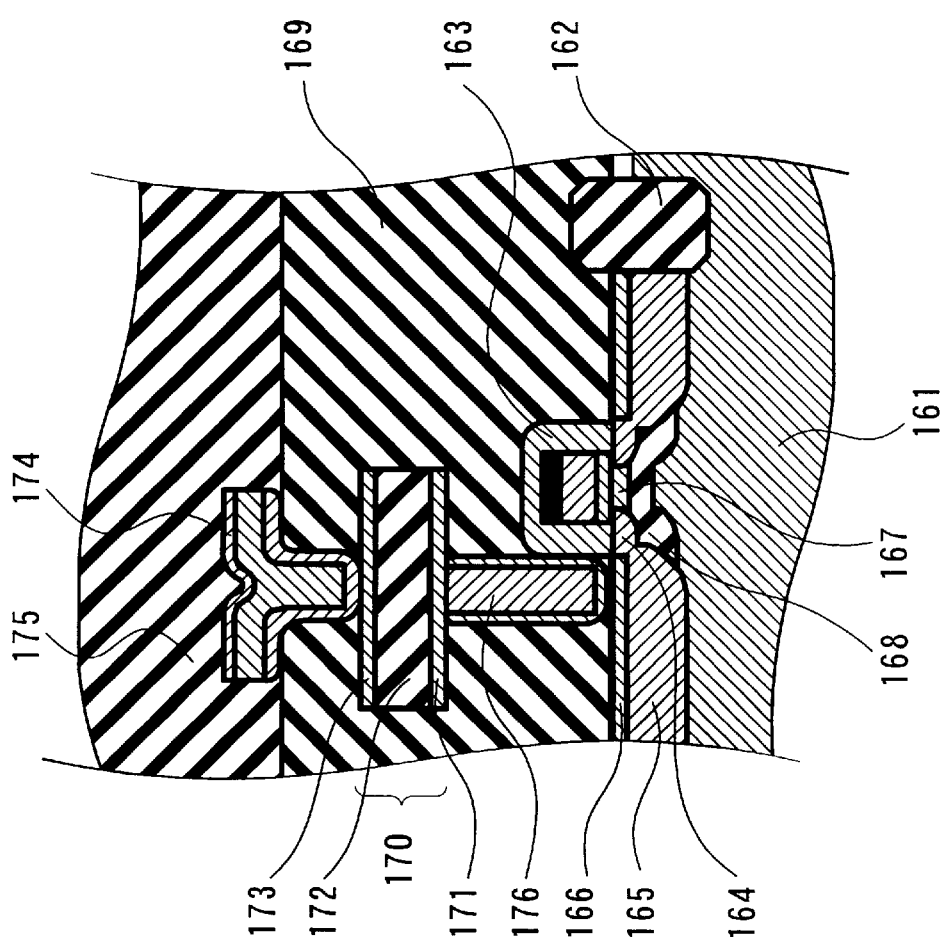
FIG. 11 is a sectional view showing a cell structure of a ferroelectric memory according to a sixth embodiment of the present invention.
Figure 12:
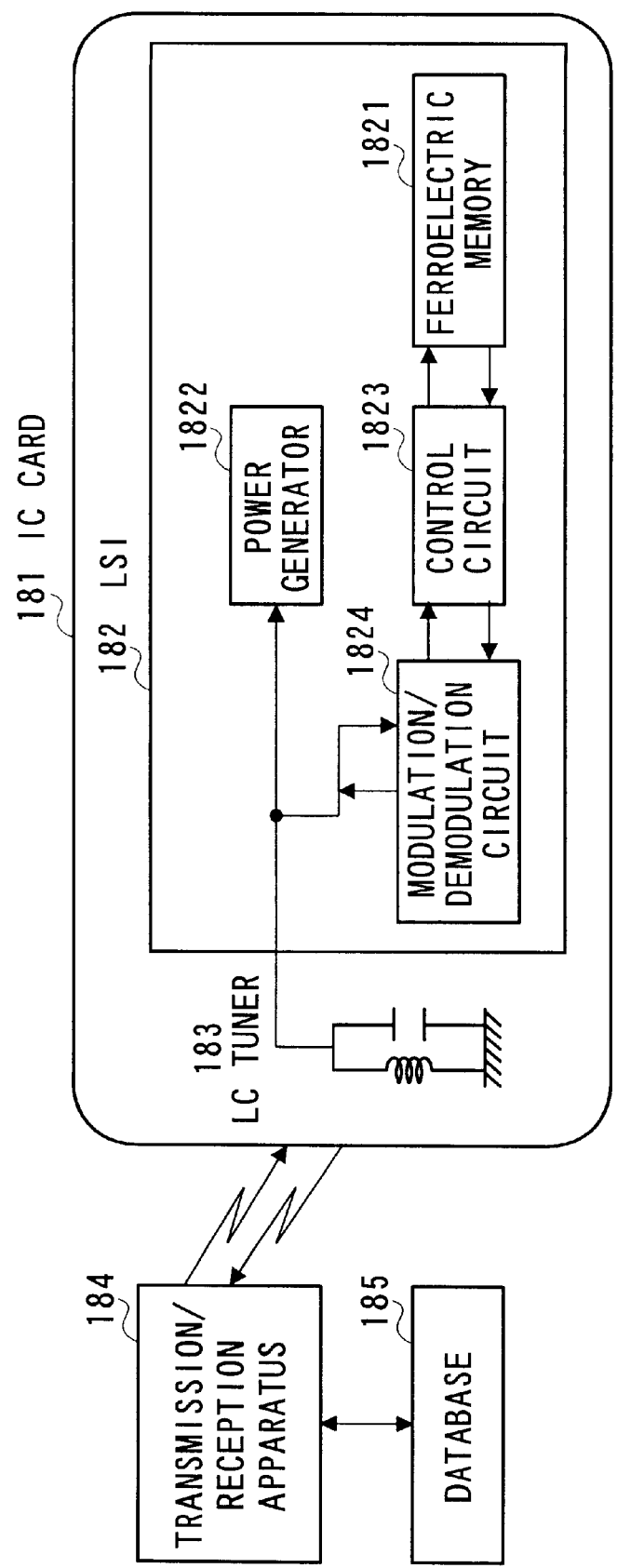
FIG. 12 is a diagram to explain a principle of a noncontanct IC card according to the sixth embodiment.

In FIG. 11, reference mark 161 denotes a p-type Si substrate. On p-type Si substrate 161, elements isolation oxide film 162 is provided by the thermal oxidation. Perfect covered word line 163 with sidewall and cap is formed in a MOSFET area. This word line 163 is formed by forming a high density n+ diffusion polysilicon layer on a gate oxide film, thereafter lining a $CoSi_2$ layer to form a contact and to reduce a wiring resistance, and further coating the polysilicon layer completely with a $SiO_2$ layer by the CVD method for the insulation.

LDD (lightly doped drain) diffusion layer 164 and high density n+ diffusion layer 165 are formed in p-type Si substrate 161. $CoSi_2$ layer 166 is formed as a bit line contact on high density n+ diffusion layer 165. Further, channel doping layer 167 is formed between LDD diffusion layer 164. Punch through stopper doping layer 168 is provided under channel doping layer 167.

Layer-insulating film 169 composed of $SiO_2$ film formed by the CVD method is formed on MOSFET. W plug 176 composed of a TiN/Ti layer and a W layer is provided on the bit line contact. W plug 176 is electrically connected to the bit line contact, and forms a contact with a high aspect ratio with ferroelectric capacitor 170. This ferroelectric capacitor 170 is composed of a Pt/Ti layer as lower electrode 171, a PZT thin film as ferroelectric thin film and a Pt thin film as upper electrode 173.

An Al wiring is formed with a TiN/Ti layer as an under coat layer on upper electrode 173 of ferroelectric capacitor 170, and further thereon, a TiN layer is formed for the prevention of the reflection and the suppression of the hillock, whereby bit line 174 is formed. Protection layer 175 composed of a silicon nitride film is formed on bit line 174.

In the configuration as described above, when PZT thin film 172 that is the ferroelectric thin film is formed, the capacitor property thereof deteriorates when the oxygen deficiency and lead deficiency occur. Then, a conventional production method requires an introduction of oxygen and a substrate heating to 600° C. or more in a film formation process in order to obtain a stoichiometric thin film. However, such a process with high temperature in oxygen background gas introduces problems that electrode materials and the MOSFET property deteriorate. In particular, in the case of the MOSFET structure matching the 0.25 μm level like the present invention, since LDD diffusion layer 164, channel doping layer 167, and punch through stopper doping layer 168 are formed by a fine adjustment of dopant profile, such a heating process affects largely as a thermal load. In addition, in the above-mentioned structure, since $CoSi_2$ layer having a salicide structure is used as bit line contact 166, and the thickness of the layer is about 30 nm, the layer deteriorates when exposed to a temperature of 500° C. or more. For the reasons described above, it is difficult to achieve the stack type structure by using a conventional method of producing a ferroelectric thin film.

Therefore, a PZT thin film is formed at a room temperature using the thin film formation method described in the fourth embodiment as a method of forming PZT thin film 172 which is a ferroelectric thin film. When the design rule has the level of 0.25 μm, a driven voltage for COMS as a driven circuit is lowered to 1.8V. Hence, in order to decrease a coercive voltage of a ferroelectric thin film, a thin film with a thickness of about 100 nm is required. Then, the thickness of the PZT thin film is set to 100 nm. In this case, it is possible to obtain an oriented thin film with the stoichiometry held in the room-temperature and non-oxygen-introduction process without causing the above problems, thereby enabling the formation of the ferroelectric memory.

Further, the film formation is carried out at a room temperature in this embodiment, however it may be possible to perform a substrate heating to a temperature of 500° or less. Furthermore, a thin film immediately after the film formation sometimes results in problems such as poor crystallinity or presence of defects. In this case, it is effective to oxidize the deposited thin film in oxygen background gases, or to anneal the deposited thin film in nitrogen background gases. The electrode materials or the MOSFET do not deteriorate when the annealing temperature is set at a temperature of 500° or less.

Still furthermore, the above explanation describes about a ferroelectric memory using a PZT thin film, however it may be possible to use other ferroelectric materials such as $SrBi_2Ta_2O_9$ (SBT), $BaTiO_3$ and $Bi_4Ti_3O_{12}$ as a material for the ferroelectric thin film.

The highly integrated ferroelectric memory according to this embodiment achieves low power consumption and high speed operation, which are not achieved by a conventional nonvolatile random access memory, and is applicable to a memory to be mounted on a system LSI. In particular, such properties are favored by an application to a chip for IC card. As an example, FIG. 12 illustrates a fundamental configuration of a noncontact IC card using the ferroelectric memory of the present invention.

Operations in IC card 181 with such a configuration are explained. First, power and data are supplied at the same time to LSI 182 included in IC card 181 by high-frequency wave. LSI 182 includes ferroelectric memory 1821, power generator 1822, control circuit 1823, and modulation/demodulation circuit 1824.

LC tuner 183 included in IC card 181 generates an electromotive force, and while performing rectify thereof, analyzes data of database 185 transmitted from transmission/reception apparatus 184 to perform necessary operations. Therefore, it is necessary that LSI 182 have low power consumption. In the case where the highly integrated ferroelectric memory described in this embodiment is used, the driving is possible at a voltage of 2V or less, and thus a IC card with downsizing low power consumption and high speed operation, which is not achieved by the conventional method, is achieved.

As described above, according to the present invention, in a laser ablation method comprising the steps of irradiating a laser beam to a target material, and depositing ejected species from the target material on a substrate to form a thin film, it is possible to obtain a thin film with the same composition as that of the target material by using a target material with almost or the same composition as that of a thin film to be obtained, and introducing an ambient gas into a reaction chamber under a constant certain pressure, thereby forming a suitable plume. Thus, it is possible to obtain a thin film with the same composition as that of the target material readily than the conventional method, without requiring an introduction of $O_2$ gas and a substrate heating. As a result, it is not necessary to limit materials for a substrate, and it is possible to adjust the adaptability of an anaerobic process.

Further, the ferroelectric memory with a ferroelectric thin film produced by the above-mentioned thin film formation method achieves the high speed, low power consumption, and high integration, and is applicable to a memory to be mounted on a system LSI such as an IC card.

The present invention is not limited to the above described embodiments, and various variations and modifications may be possible without departing from the scope of the present invention.

This application is based on the Japanese Patent Applications No. HEI10-256156 filed on Sep. 10, 1998 and No. HEI11-247205 filed on Sep. 1, 1999, entire content of which is expressly incorporated by reference herein.

What is claimed is:

1. A thin film formation method comprising:

placing a target material and a substrate in a reaction chamber;

adjusting a pressure (P) of an ambient gas to be introduced to said reaction chamber and a distance (D) between said substrate and said target material so that crystal nucleus growth in a vapor phase is carried out in an area generated by a shock front in which oxidization is promoted;

exciting said target material by irradiating a laser beam to said target material, while introducing said ambient gas into said reaction chamber under said pressure; and forming a thin film by depositing species, which are contained in said target material and ejected from said target material by being irradiated by the laser beam, on said substrate.

2. The method according to claim 1, wherein said pressure (P) of the ambient gas and said distance (D) between said substrate and said target material are adjusted according to a following equation:

$$PD^n = \text{constant},$$

wherein n is approximately 2 to 3.

3. The method according to claim 1, wherein said ambient gas is an inert gas.

4. The method according to claim 1, said ambient gas is a mixed gas of an inert gas and a reactive gas, and an amount of said reactive gas is 50 parts by volume or less of said ambient gas.

5. The method according to claim 4, wherein said reactive gas contains an oxidizing gas selected from the group consisting of $O_2$, $O_3$, $N_2O$ and $NO_2$.

6. The method according to claim 1, wherein said pressure of the ambient gas ranges from 0.1 to 10 Torr.

7. The method according to claim 1, wherein said method further comprises varying said pressure of the ambient gas.

8. The method according to claim 1, wherein a material composing said target material is an oxide.

9. The method according to claim 8, wherein said oxide is a transparent conducting oxide selected from the group consisting $In_2O_3$, $SnO_2$, ITO, ZnO, $TiO_2$, $WO_3$ and $CuAlO_2$.

10. The method according to claim 8, wherein said oxide is a ferroelectric material selected from the group consisting $PbZrTiO_3$ (PZT), $SrBi_2Ta_2O_9$ (SBT), $BaTiO_3$ and $Bi_4Ti_3O_{12}$.

11. The method according to claim 1, wherein a material composing said target material is a nitride.

12. A thin film formation method comprising:

placing a substrate and a target material including at least two kinds of areas with different compositions in a target material in a reaction chamber;

adjusting a pressure (P) of an ambient gas and a distance (D) between said substrate and said target material so that crystal nucleus growth in a vapor phase is carried out in an area generated by a shock front in which oxidization is promoted and which forms a shock front;

exciting said target material by irradiating a laser beam to said target material, while introducing said ambient gas into said reaction chamber under said pressure; and forming a thin film by depositing species, which are contained in said target material and ejected from said target material by being irradiated by the laser beam, on said substrate.

13. The method according to claim 12, wherein said pressure (P) of the ambient gas and said distance (D) between said substrate and said target material are adjusted according to a following equation:

$$PD^n = \text{constant},$$

wherein n is approximately 2 to 3.

14. The method according to claim 12, wherein said laser beam is irradiated to a boundary portion between said at least two areas.

15. The method according to claim 12, wherein said at least two areas are an area composed of a semiconductor material including an element belonging to the IV group of the periodic table and another area composed of a transparent conducting oxide.

* * * * *

UNITED STATES PATENT AND TRADEMARK OFFICE
CERTIFICATE OF CORRECTION

PATENT NO. : 6,451,391 B1
DATED : September 17, 2002
INVENTOR(S) : Y. Yamada et al.

It is certified that error appears in the above-identified patent and that said Letters Patent is hereby corrected as shown below:

<u>Title page,</u>
Item [56], References Cited, OTHER PUBLICATIONS, the following references were omitted and should be included:

-- English Language Abstract of 62-222058.
  English Language Abstract of 5-270830 --.

Signed and Sealed this

Twenty-fifth Day of February, 2003

JAMES E. ROGAN
*Director of the United States Patent and Trademark Office*